United States Patent
Chae et al.

(10) Patent No.: US 10,899,963 B2
(45) Date of Patent: Jan. 26, 2021

(54) LIGHT-EMITTING STRUCTURE, OPTICAL MEMBER HAVING THE LIGHT-EMITTING STRUCTURE, LIGHT-EMITTING DEVICE, AND LIQUID CRYSTAL DISPLAY APPARATUS

(71) Applicant: RESEARCH & BUSINESS FOUNDATION SUNGKYUNKWAN UNIVERSITY, Suwon-si (KR)

(72) Inventors: Heeyeop Chae, Suwon-si (KR); Ho Seok Jin, Suwon-si (KR); Chang Min Lee, Suwon-si (KR); Bo Kyoung Kim, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 379 days.

(21) Appl. No.: 16/031,145

(22) Filed: Jul. 10, 2018

(65) Prior Publication Data
US 2019/0010391 A1  Jan. 10, 2019

(30) Foreign Application Priority Data
Jul. 10, 2017 (KR) .......... 10-2017-0087045

(51) Int. Cl.
| | | |
|---|---|---|
| C09K 11/02 | (2006.01) | |
| C09K 11/62 | (2006.01) | |
| C09K 11/06 | (2006.01) | |
| C09K 11/08 | (2006.01) | |
| C08F 220/28 | (2006.01) | |
| C08F 292/00 | (2006.01) | |
| H01L 51/00 | (2006.01) | |
| H01L 51/50 | (2006.01) | |

(52) U.S. Cl.
CPC ............ *C09K 11/62* (2013.01); *C08F 220/28* (2013.01); *C08F 292/00* (2013.01); *C09K 11/06* (2013.01); *C09K 11/08* (2013.01); *H01L 51/004* (2013.01); *H01L 51/0043* (2013.01); *H01L 51/0079* (2013.01); *H01L 51/0092* (2013.01); *C08F 220/282* (2020.02); *C09K 11/02* (2013.01); *H01L 51/502* (2013.01)

(58) Field of Classification Search
CPC .............................. C09K 11/02; C09K 11/00
See application file for complete search history.

(56) References Cited

U.S. PATENT DOCUMENTS

| | | | | |
|---|---|---|---|---|
| 8,907,047 B2* | 12/2014 | Park | .......................... | C08K 3/10 |
| | | | | 528/363 |
| 2012/0241646 A1* | 9/2012 | Zhong | .................... | B82Y 40/00 |
| | | | | 250/459.1 |
| 2017/0052444 A1* | 2/2017 | Park | ..................... | C08F 220/14 |
| 2017/0059986 A1* | 3/2017 | Jun | ....................... | C09K 11/08 |
| 2019/0055465 A1* | 2/2019 | Park | ....................... | C08L 33/10 |
| 2019/0112523 A1* | 4/2019 | Kim | ....................... | C09K 11/02 |

* cited by examiner

Primary Examiner — Matthew E. Hoban
(74) Attorney, Agent, or Firm — NSIP Law

(57) ABSTRACT

A light-emitting structure in accordance with the present disclosure includes inorganic nano-particles; ligands coordinated to surfaces of the inorganic nano-particles, wherein each of the ligands contains an acrylic polymer. Further, the present disclosure provides an optical member, a light-emitting device, and a liquid crystal device including the light-emitting structure.

10 Claims, 3 Drawing Sheets

[FIG. 1]
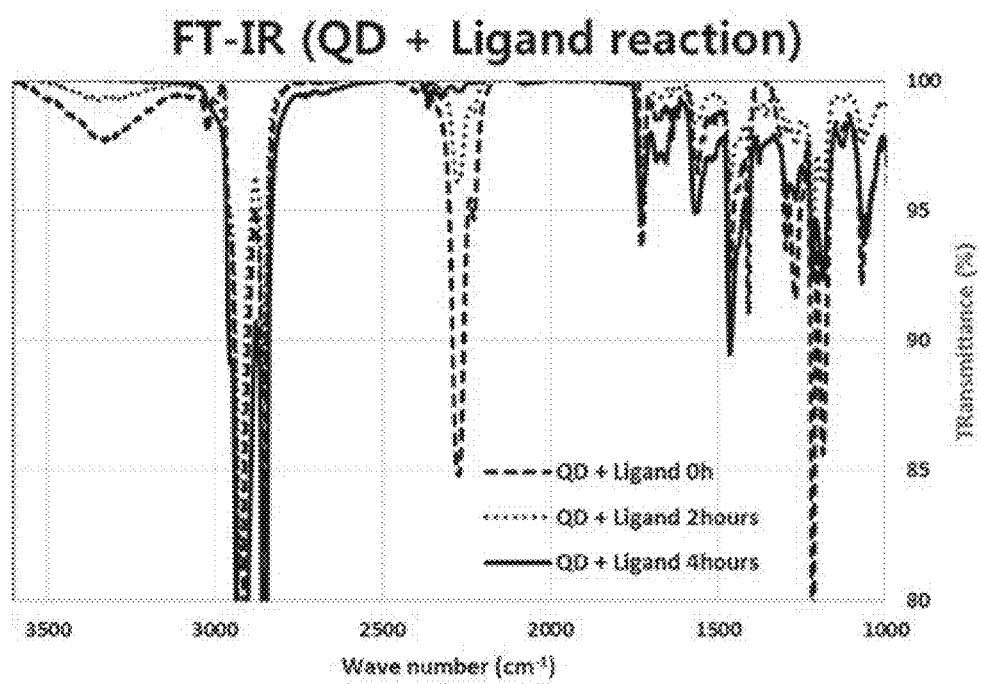

[FIG. 2]
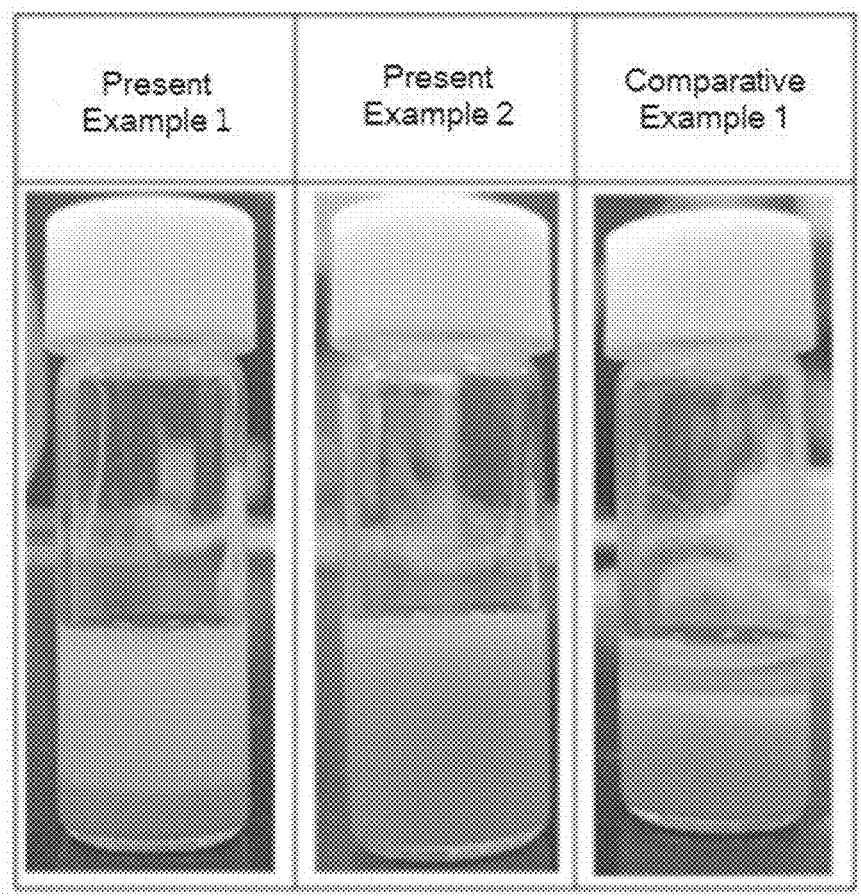

[FIG. 3]
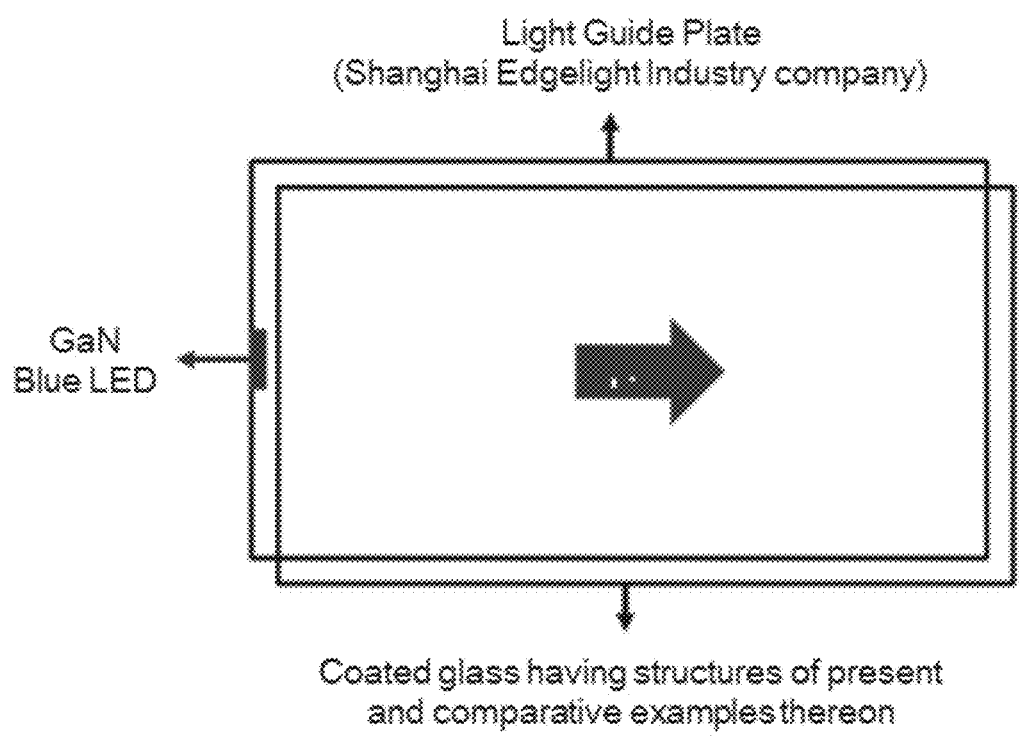

01
LIGHT-EMITTING STRUCTURE, OPTICAL MEMBER HAVING THE LIGHT-EMITTING STRUCTURE, LIGHT-EMITTING DEVICE, AND LIQUID CRYSTAL DISPLAY APPARATUS

CROSS-REFERENCE TO RELATED APPLICATIONS

This application claims the priority of Korean Patent Application No. 10-2017-0087045 filed on Jul. 10, 2017, in the Korean Intellectual Property Office, the disclosure of which is hereby incorporated by reference in its entirety.

BACKGROUND

1. Technical Field

The present disclosure relates to a light-emitting structure, and an optical member, a light-emitting device, and a liquid crystal device including the structure. More particularly, the present disclosure relates to a light-emitting structure having improved compatibility, and an optical member, a light-emitting device, and a liquid crystal device including the structure.

2. Description of the Related Art

A liquid crystal device (LCD) converts various electrical information into visual information using a change in liquid crystal transmittance according to a voltage applied to the liquid crystal device (LCD). Liquid crystal devices have no self-luminescence and require a backlight. However, LCDs are widely used because they may be implemented in a lightweight and to have a thin shape with a low power consumption.

The liquid crystal device includes a backlight unit (BLU), as a light emitting device, which provides light at a back of the display panel. The liquid crystal devices may be classified into a direct type LCD or an edge type LCD depending on a position of a light emitting diode (LED) as a light source.

There is disclosed a technique in which a blue light emitting diode is used as a backlight unit light source, and, inorganic nano-particles receive the blue light and emit red light and green light to mixing them to output white light to a display panel. Alternatively, there is disclosed a technique in which blue, green, and red inorganic nano-particles are stacked to render white light as backlight. In the latter case, white light rendered using the luminescent inorganic nano-particles has high brightness and excellent color reproducibility.

However, when a film is produced using the inorganic nano-particles or when the inorganic nano-particles are used in combination with other compositions, the compatibility of the inorganic nano-particles may be poor. Further, even when producing the light emitting diode using the inorganic nano-particles, a ligand on the surfaces of the inorganic nano-particles plays the role of an insulator and, thus, electric efficiency is lowered, so that the light efficiency is lowered.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to facilitate an application of the inorganic nano-particles to an optical member and a light-emitting structure to allow improved compatibility of the inorganic nano-particles. Thus, a purpose of the present disclosure is to provide a light emitting structure including the inorganic nano-particles such that a smooth charge flow may be induced therein.

Another purpose of the present disclosure is to provide an optical member or light-emitting device comprising the light-emitting structure.

Still another object of the present disclosure is to provide a liquid crystal device comprising the optical member or the light-emitting device.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided a light-emitting structure including inorganic nano-particles; and ligands coordinated to surfaces of the inorganic nano-particles, wherein each of the ligands includes a polymer having a structure represented by a following chemical formula 1:

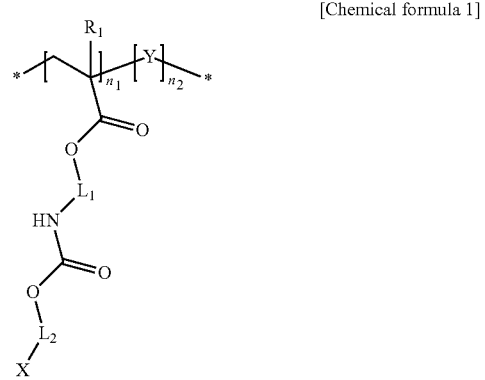

[Chemical formula 1]

where X represents —SH, —P=OO, —C=OO or —HN2;

each of $L_1$ and $L_2$ independently an alkylene group having 1 to 24 carbon atoms, a cycloalkylene group having 3 to 24 carbon atoms, an arylene group having 6 to 24 carbon atoms, or a heteroarylene group having 4 to 24 carbon atoms;

at least one hydrogen atom of the alkylene group is substituted or unsubstituted with a cycloalkyl group having 3 to 24 carbon atoms, an aryl group having 6 to 24 carbon atoms, or a heteroaryl group having 4 to 24 carbon atoms;

$R_1$ represents hydrogen or a methyl group;

$n_1$ and $n_2$ each independently represent a natural number of 1 or larger;

Y represents a following chemical formula 2 or chemical formula 3:

[Chemical formula 2]

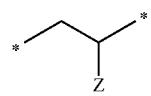

[Chemical formula 3]

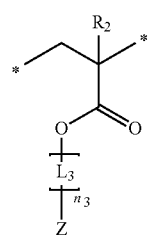

in the chemic/al formulas 2 and 3, Z represents an alkyl group having 1 to 12 carbon atoms, a cycloalkyl group having 3 to 24 carbon atoms, an aryl group having 6 to 24 carbon atoms, two or more heteroaryl groups or metallocenes connected to C, O, S, Se, N or P;

$R_2$ represents hydrogen or a methyl group;

$L_3$ represents, polyethyleneoxy or ethyleneurethane, or alkylene group having 1 to 12 carbon atoms;

$n_3$ represents 0 or a natural number of 1 or larger.

In one embodiment of the light-emitting structure, a content of the polymer represented by the chemical formula is in a range of about 1 wt % to about 95 wt % with respect to a total weight of the ligand coordinated to the surface of the inorganic nano-particle.

In one embodiment of the light-emitting structure, the polymer having the structure represented by the chemical formula 1 includes repeating units copolymerized with monomers having an acrylic functional group or a vinyl group.

In one embodiment of the light-emitting structure, the inorganic nanoparticle absorbs ultraviolet or visible light and emits visible light in a wavelength range of 400 nm to 750 nm.

In one embodiment of the light-emitting structure, the inorganic nanoparticle has a diameter of 1 nm to 30 nm.

In one embodiment of the light-emitting structure, the ligand represented by the chemical formula 1 is acquired between ligand-exchange between a ligand having a hydroxyl group as a terminal functional group thereof coordinated on the surface of the inorganic nano-particle and a polymer ligand having a structure represented by a following chemical formula 4:

[Chemical formula 4]

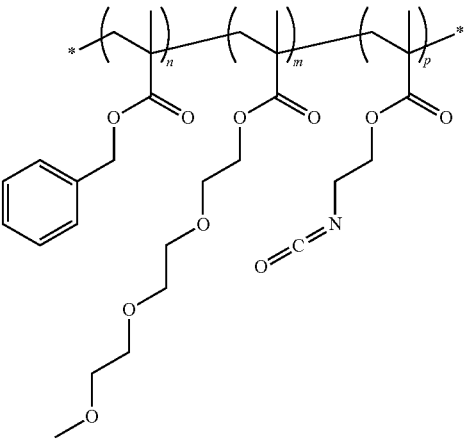

in the chemical formula 4, n, m and p each independently indicates a natural number equal to or greater than 1.

In one embodiment of the light-emitting structure, the ligand represented by the chemical formula 1 is bound to the surface of the inorganic nano-particle to exhibit a structure having a following chemical formula 5:

[Chemical formula 5]

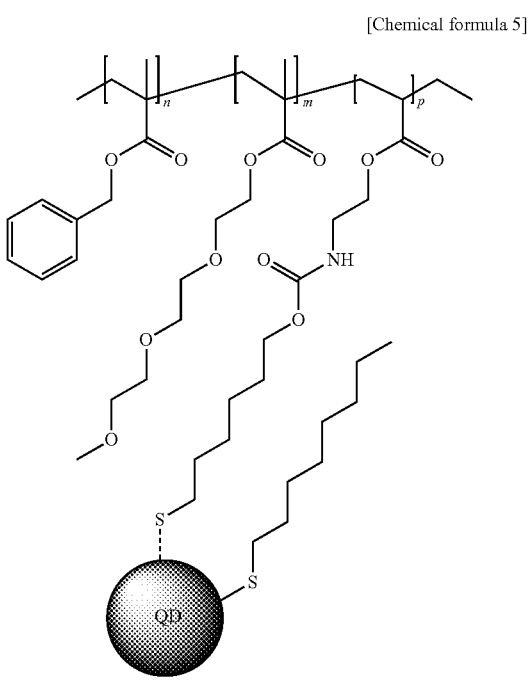

in the chemical formula 5, n, m and p each independently indicates a natural number equal to or greater than 1.

In another aspect of the present disclosure, there is provided an optical member comprising the light-emitting structure as defined above.

In still another aspect of the present disclosure, there is provided a light-emitting device comprising the light-emitting structure as defined above.

In still yet aspect of the present disclosure, there is provided a liquid crystal display device comprising the light-emitting structure as defined above.

Effects of the present disclosure may be as follows but be limited thereto:

According to the present disclosure, in the synthesis of the inorganic nano-particles, a compound having an alcohol group and a compound having a thiol group may be introduced as a ligand material. Then, separately-synthesized polymer may react with the alcohol group on the inorganic nano-particles surface to form a new ligand structure with a urethane bond. This ligand modification alter may the property of the inorganic nanoparticle to be adapted to the application thereof. In particular, the compatibility thereof with other compositions may be increased when the light-emitting structure is used to form a film. Further, when producing a light emitting diode, more smooth flow of electric charge may be induced in the light-emitting structure. Particularly, the light-emitting structure according to the present disclosure may be easily mixed and uniformly dispersed in the polymer solution constituting the film. This may allow easy producing of the film having the light conversion property. Furthermore, the light-emitting structure according to the present disclosure may be stably applied to the light-emitting device that implements white light.

Further specific effects of the present disclosure as well as the effects as described above will be described in conduction with illustrations of specific details for carrying out the invention.

BRIEF DESCRIPTION OF DRAWINGS

FIG. 1 shows FT-IR analysis of a sample 3 according to one embodiment of the present disclosure.

FIG. 2 shows results of compatibility evaluations for evaluated samples 1 and 2 containing samples according to one embodiment of the present disclosure, and for a comparative sample 1.

FIG. 3 is an illustration of a device prepared for quantum efficiency evaluation.

DETAILED DESCRIPTION

Descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, and components have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one or when preceding a list of" elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure.

A light-emitting structure according to the present disclosure may include inorganic nano-particles; and ligands coordinated to surfaces of the inorganic nano-particles, wherein each of the ligands includes a polymer having a structure represented by a following chemical formula 1:

[Chemical formula 1]

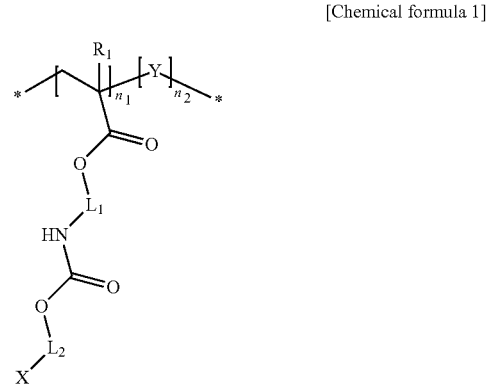

where X represents —SH, —P=OO, —C=OO or —HN2;

each of $L_1$ and $L_2$ independently an alkylene group having 1 to 24 carbon atoms, a cycloalkylene group having 3 to 24 carbon atoms, an arylene group having 6 to 24 carbon atoms, or a heteroarylene group having 4 to 24 carbon atoms;

at least one hydrogen atom of the alkylene group is substituted or unsubstituted with a cycloalkyl group having 3 to 24 carbon atoms, an aryl group having 6 to 24 carbon atoms, or a heteroaryl group having 4 to 24 carbon atoms;

$R_1$ represents hydrogen or a methyl group;

$n_1$ and $n_2$ each independently represent a natural number of 1 or larger;

Y represents a following chemical formula 2 or chemical formula 3:

[Chemical formula 2]

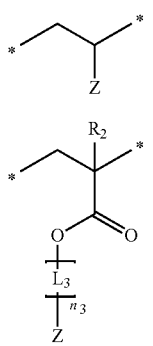

[Chemical formula 3]

in the chemical formulas 2 and 3, Z represents an alkyl group having 1 to 12 carbon atoms, a cycloalkyl group having 3 to 24 carbon atoms, an aryl group having 6 to 24 carbon atoms, two or more heteroaryl groups or metallocenes connected to C, O, S, Se, N or P;

$R_2$ represents hydrogen or a methyl group, $L_3$ represents, polyethyleneoxy or ethyleneurethane, or alkylene group having 1 to 12 carbon atoms;

$n_3$ represents 0 or a natural number of 1 or larger.

In the chemical formulas 2 and 3, an example of Z may include as least one selected from a group consisting of: methyl, ethyl, isopropyl, propyl, phenyl, benzyl, butyl, biphenyl, polyethyleneoxy, carbazole, dibenzothiophene, dibenzofuran, dibenzoselenophene, phenoxazine, dihydrophenazine, morpholine, dialkylamine, ammonium, cyclohexane, phosphine, phosphate, phenols, etc.

In each of the chemical formulas 1 to 3, * indicates a joint with the same or different repeating unit.

A material of the inorganic nano-particle may be selected from a group consisting of a Group II-VI compound, a Group II-V compound, a Group III-V compound, a Group III-IV compound, a Group III-VI compound, a Group IV-IV compound, or a mixture thereof.

The mixture includes a simple mixture of the above compounds, a ternary compound, a quaternary compound, and a mixture doped with a dopant.

An example of the Group II-VI compound may include magnesium sulfide (MgS), magnesium selenide (MgSe), magnesium telluride (MgTe), calcium sulfide (CaS), calcium selenium (CaSe), calcium telluride (CaTe), strontium sulfide (SrS), strontium selenide (SrSe), strontium telluride (SrTe), cadmium sulfide (CdS), cadmium selenide (CdSe), tellurium cadmium (CdTe), zinc sulfide (ZnS), zinc selenide (ZnSe), zinc telluride (ZnTe), mercury sulfide (HgS), mercury selenide (HgSe) or mercury telluride (HgTe), etc.

An example of the Group II-V compound may include zinc phosphide ($Zn_3P_2$), zinc arsenide ($Zn_3As_2$), cadmium phosphide ($Cd_3P_2$), cadmium arsenide ($Cd_3As_2$), cadmium nitride ($Cd_3N_2$) or zinc nitride ($Zn_3N_2$), etc.

An example of the Group III-V compound may include boron phosphide (BP), aluminum phosphide (ALP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN) or boron nitride (BN), etc.

An example of the Group III-IV compound may include boron carbide ($B_4C$), aluminum carbide ($Al_4C_3$), gallium carbide ($Ga_4C$), etc.

An example of the Group III-VI compound may include aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$) or indium telluride ($In_2Te_3$).

An example of the Group IV-VI compound may include lead sulfide (PbS), lead selenide (PbSe), lead telluride (PbTe), tin sulfide (SnS), tin selenide (SnSe) or tin telluride (SnTe), etc.

In one example, each of the inorganic nano-particles may have a core/shell structure. Each of the core and shell of the inorganic nano-particles may be made of the above-exemplified compounds. The above-exemplified compound may be used alone or in combination with at least one further above-exemplified compound to form the core or the shell. A bandgap of the compound constituting the core may be narrower than a bandgap of the compound constituting the shell. The present invention is not limited thereto.

However, when the inorganic nano-particle has a core/shell structure, the compound constituting the shell may be different from the compound constituting the core. For example, the inorganic nano-particle may have a CdZnS/ZnS (core/shell) structure having a core containing CdZnS and a shell containing ZnS. As another example, the inorganic nano-particle may have a core/multi-shell structure having at least two or more shells. For example, the inorganic nano-particle may have CdZnS/ZnS/ZnS (core/first shell/second shell) structure. That is, the structure may include a core comprising CdZnS, a first shell surrounding the surface of the core and including ZnS, and a second shell surrounding the surface of the first shell and including ZnS. The inorganic nano-particle 121 may have a single structure, not the core/shell structure. In this case, the single structure may be composed of only the group II-VI compound.

The inorganic nanoparticle may further include a cluster molecule as a seed. The cluster molecule is a compound that acts as a seed in the process of producing the inorganic nanoparticle. Precursors of the compound constituting the inorganic nanoparticle grow on the cluster molecule. As a result, the inorganic nano-particle may be formed. In this connection, an example of the cluster molecule may be disclosed in Korean Patent Application Publication No. 2007-0064554. However, the present invention is not limited thereto.

During the inorganic nanoparticle producing process described above, the stabilizing compound is coordinated to the surface of the inorganic nano-particle. The stabilizing compound prevents adjacent inorganic nano-particles from coagulating each other and quenching, thereby stabilizing the inorganic nano-particles. The stabilizing compound may bind to the inorganic nano-particles and have hydrophobicity.

Examples of the stabilizing compound may include an amine compound or a carboxylic acid compound having an alkyl group having 6 to 30 carbon atoms. Examples of the amine compound having the alkyl group may include hexadecylamine or octylamine, and the like. Another example of the ligand may include an amine compound or a carboxylic acid compound having an alkenyl group having 6 to 30 carbon atoms.

Alternatively, the stabilizing compound may include a phosphine compound including trioctylphosphine, triphenylphosphine, t-butylphosphine, and the like; phosphine oxide such as trioctylphosphine oxide; pyridine or thiophene, etc.

Alternatively, the stabilizing compound may comprise a silane-based compound having at least one functional group selected from a vinyl group, an aryl group, an acrylic group, an amine group, a methacrylate group, and an epoxy group. The compound may have an alcohol group at a terminal thereof. Such a compound may include a polymer having a molecular weight of 1,000 to 500,000 and having a urethane bond formed via reaction between an isocyanate group with an alcohol group.

At least portions of the polymer having the structure represented by chemical formula 1 and the stabilizing compound as exemplified above may be exchanged each other. Thus, in the light-emitting structure according to the present disclosure, the content of the polymer having the structure represented by chemical formula 1 may be in a range of about 1 to about 95 W % with respect to the total weight of the ligand coordinated to the surfaces of the inorganic nano-particles. In this connection, unlike the polymer having the structure represented by the chemical formula 1, the content of another compound contained in the ligand, that is. the stabilizing compound may be in a range of about 5 to about 99% by weight.

In one example, the weight-average molecular amount of the polymer having the structure represented by the chemical formula 1 may be in a range of about 1,000 to about 500,000. When the weight average molecular amount of the polymer having the structure represented by the chemical formula 1 is smaller than about 1,000, there is almost no modification effect of the ligand on the surfaces of inorganic nano-particles because the ligand does not contain enough functional groups. Conversely, when the weight average molecular amount is above about 500,000, the inherent electrical and optical properties of inorganic nano-particles may deteriorate due to too long-repeating units.

The polymer having the structure represented by the chemical formula 1 may further include a repeating unit copolymerized with monomers having an acrylic functional group or a vinyl group.

The inorganic nanoparticles may be luminescent particles that absorb ultraviolet light or visible light and emit visible light of 400 nm to 750 nm.

The size of each of the inorganic nano-particles may be in a range of 1 to 30 nm.

The light-emitting structure according to the present disclosure as illustrated above may include a ligand coordinated to the surfaces of the inorganic nano-particles, wherein the ligand may include a polymer containing the structure represented by the chemical formula 1 in addition to the conventional stabilizing compound. Thus, this may improve compatibility of light-emitting structures to many applications thereof. In the synthesis of the inorganic nano-particles, a compound having an alcohol group and a compound having a thiol group are introduced as a ligand material. Then, separately-synthesized polymer may react with the alcohol group on the inorganic nano-particles surface to form a new ligand structure with a urethane bond. This ligand modification alter may the property of the inorganic nanoparticle to be adapted to the application thereof. In particular, the compatibility thereof with other compositions may be increased when the light-emitting structure is used to form a film. Further, when producing a light emitting diode, more smooth flow of electric charge may be induced in the light-emitting structure.

Particularly, the light-emitting structure according to the present disclosure may be easily mixed and uniformly dispersed in the polymer solution constituting the film. This may allow easy producing of the film having the light conversion property. Furthermore, the light-emitting structure according to the present disclosure may be stably applied to the light-emitting device that implements white light.

Hereinafter, the production of the light-emitting structure according to one embodiment of the present disclosure and the application of the light-emitting structure to a formation of a photo-conversion film will be described with reference to specific producing examples and evaluations of their properties. Preferable examples of the present disclosure will be described in more detail. The following examples may be merely illustrative but may not be limiting.

Hereinafter, a preferred example of the present disclosure is described. However, the following examples are only one example of the present disclosure, and the present disclosure is not limited to the following examples.

Synthesis Example 1: Producing Red-Light Inorganic Nano-Particles

The following process was used to produce red-light-emitting inorganic nano-particles with a ligand with a hydroxy group.

Specifically, 0.146 g of indium acetate (Aldrich company), 0.46 g of zinc acetate (Aldrich company), 2.1 g of oleic acid (Aldrich company), and 15 mL of 1-octadecene (Aldrich company) were input in a 50 mL three-openings round flask coupled to a reflux device, to obtain a mixture. The mixture was heated to 110 degrees C. and maintained at about 0.1 torr using a vacuum pump for 1 hour. The vacuum was removed therefrom and $N_2$ gas was charged into the mixture and then heated to 280 degrees C. Then, 0.125 g of tris(trimethylsilyl)phosphine (Gelest company) was added to the mixture at once.

Then, 0.04 g of sulfur (Aldrich company) and 0.1 g of selenium (Aldrich company) were dissolved in trioctyl phosphine to prepare a solution. This solution was added to the reactor containing the mixture. Thereby, a second mixture is obtained. The temperature of the reactor was lowered to 240 degrees C. and held for 3 hours. Then, a mixture of 1.2 mL of 1-dodecanethiol (Aldrich company) and 0.3 mL of 6-mercaptohexanol (Aldrich company) was added to the second mixture to obtain a third mixture. Then, the third mixture was further stirred for 30 minutes and cooled to room temperature.

To the third mixture was added 20 mL of ethanol (Aldrich company), which was stirred for 5 minutes. Then, precipitates were obtained by using a centrifuge. As a result, red-light inorganic nano-particles were obtained. Then, the particles were dissolved in toluene (Aldrich company) at a concentration of 5 wt %. The red-light inorganic nano-particles thus obtained were analyzed using an Absolute PL quantum yield spectrometer QE-2100 instrument available from Otsuka electronics company.

From the analysis, the measured quantum yield was 52%; the measured photoluminescence $1_{max}$ was 620 nm; the measured FWHM (Full Width of Half Max) was 78 nm; a particle size of each of the obtained luminescent inorganic nanoparticles (example 1) was measured using a TEM (JEOL company/JEM-3010). It was confirmed that the size was about 5 nm.

Synthesis Example 2: Producing Red-Light Inorganic Nano-Particles

Light inorganic nano-particles (example 2) were produced via substantially the same procedure as in the synthesis example 1, except that the mixture between 1.2 mL of 1-dodecanethiol (Aldrich company) and 0.3 mL of 6-mercaptohexanol (Aldrich company) was not added.

The red-light inorganic nano-particles thus obtained (example 2) were analyzed using an Absolute PL quantum yield spectrometer QE-2100 instrument available from Otsuka electronics company.

From the analysis, the measured quantum yield was 50%; the measured photoluminescence $1_{max}$ was 620 nm; the measured FWHM (Full Width of Half Max) was 78 nm; a particle size of each of the obtained luminescent inorganic nanoparticles (example 2) was measured using a TEM (JEOL company/JEM-3010). It was confirmed that the size was about 5 nm.

Synthesis Example 3: Producing Acrylic Polymer 70 mL of toluene, 13.5 g of benzyl methacrylate (Aldrich company), 15 g of FA-213 (Hitachi chemical company), 1.5 g of 2-isocyanatoethyl methacrylate (TCI company), and 1.5 g of V-59 (Wako chemical company) were added input in a 250 mL three-openings round flask coupled to a reflux device, to obtain a mixture. The mixture was heated to 80° C. and stirred for 3 hours to synthesize an acrylic polymer represented by the following chemical formula 4. Gel permeation chromatography (Agilent company) was used to analyze the molecular weight of the synthesized polymer. A weight average molecular weight of 22,000 was measured.

<Chemical formula 4>

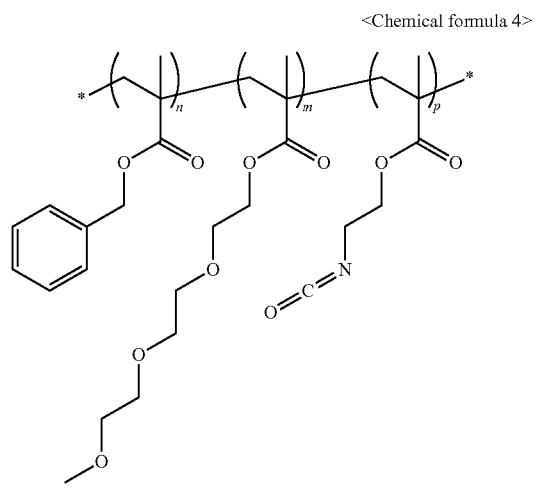

Producing Light-Emitting Structure: Producing Present Samples 1 to 3

The red-light inorganic nano-particles obtained based on the synthesis example 1 and the acrylic polymer represented by the chemical formula 4 were mixed with each other to obtain a mixture. The mixture was stirred at 40° C. for 4 hours to perform ligand exchange.

In present example 1, present sample 1 was prepared by mixing and reacting 1 g of red-light inorganic nano-particles obtained based on synthesis example 1 and 0.3 g of acrylic polymer represented by chemical formula 4.

In present example 2, present sample 2 was prepared by mixing and reacting 1 g of red-light inorganic nano-particles obtained based on synthesis example 1 and 0.6 g of acrylic polymer represented by chemical formula 4.

In present example 3, present sample 3 was prepared by mixing and reacting 1 g of red-light inorganic nano-particles obtained based on synthesis example 1 and 1 g of acrylic polymer represented by chemical formula 4.

In each of present examples 1 to 3, a structure of the inorganic nano-particle whose the ligand is substituted with the acrylic polymer synthesized above has a chemical formula 5 below:

<Chemical formula 5>

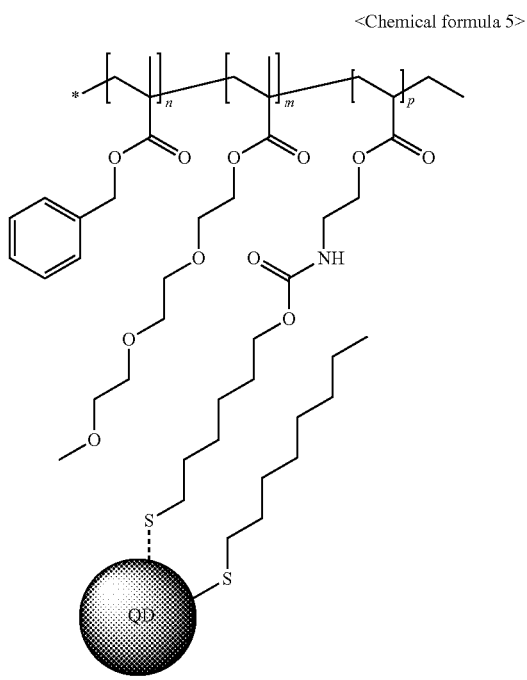

FT-IR Analysis Result

During the producing process of the sample 3, FT-IR analysis was performed based on the reaction timing. The results are shown in FIG. 1.

FIG. 1 shows a FT-IR analysis result of the sample 3 according to one embodiment of the present disclosure.

Referring to FIG. 1, it is confirmed that, as reaction timing elapses, an alcohol OH peak due to the ligand having a hydroxyl group on the red-light inorganic nano-particles as obtained based on the above synthesis example 1, and a peak of an isocyanate group N=C=O of the ligand expressed as the chemical formula 4 as obtained based on the above synthesis example 3 disappears.

That is, it may be confirmed that due to the substitution between the initial ligand and the ligand represented by the chemical formula 4, the acrylic polymer ligand is conjugated on the surfaces of the nanoparticles, according to the present disclosure.

Compatibility Evaluation 1 mL of a solution of the sample 2 dispersed in toluene, and 2 mL of acetone were mixed to prepare an evaluation sample 1.

Furthermore, 1 mL of a solution of the sample 3 dispersed in toluene, and 2 mL of acetone were mixed to prepare an evaluation sample 2.

1 mL of a solution of the red-light inorganic nano-particles obtained based on the synthesis example 2 in toluene, and 2 mL of acetone were mixed to prepare a comparative sample 1. Evaluated samples 1 and 2 and comparative sample 1 were photographed. The results are shown in FIG. 2.

FIG. 2 shows the results of the evaluation of the compatibility of the evaluated samples 1 and 2 and comparative sample 1, wherein the samples 1 and 2 include the samples according to one present embodiment of the present disclosure.

Referring to FIG. 2, it may be seen that the comparative sample 1 is not mixed with acetone at all. Evaluated samples 1 and 2 (present examples 1 and 2) may be confirmed to be highly compatible with acetone. In particular, it may be confirmed that sample 3 having a relatively larger content of ligand-exchanged polymer is more compatible with acetone than the sample 2 having a relatively smaller content of ligand-exchanged polymer.

Quantum Efficiency Evaluation

The above-prepared evaluated samples 1 and 2 and comparative sample 1 were each spin-coated on a glass substrate at 300 rpm for 10 seconds. Thereafter, the spin-coated samples were baked on a hot-plate at 120° C. for 1 minute to remove the residual solvent. The samples were then placed on a test device as in FIG. 3. Then, an absolute PL quantum yield was measured using QE-2100 available from Otsuka electronics company. The results are shown in Table 1 below.

TABLE 1

| Films | Quantum efficiency: % |
| --- | --- |
| Film using sample 1 | 32 |
| Film using sample 2 | 35 |
| Film using sample 3 | 43 |
| Film using comparative sample 1 | 19 |

Referring to Table 1, it may be confirmed that the quantum efficiency of the structure using each of the present samples 1 to 3 is about twice the quantum efficiency of the structure using the comparative sample 1. This is because the ligand containing the polymer according to the present disclosure keeps the distance between the inorganic nano-particles sufficiently spaced to prevent energy transfer therebetween.

It may be confirmed that, between the structures using the present samples 1 to 3, the structure having a larger loading amount of the ligand according to the present disclosure shows a higher quantum efficiency than the structure having a small loading amount of the ligand according to the present disclosure.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:

1. A light-emitting structure including:
inorganic nano-particles; and
a ligand coordinated to a surface of each of the inorganic nano-particles, wherein the ligand includes a polymer having a structure represented by a following chemical formula 1:

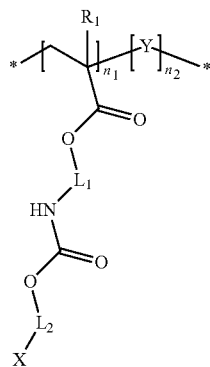

[Chemical formula 1]

wherein X represents —SH, —P=OO, —C=OO or —HN2;

each of $L_1$ and $L_2$ independently an alkylene group having 1 to 24 carbon atoms, a cycloalkylene group having 3 to 24 carbon atoms, an arylene group having 6 to 24 carbon atoms, or a heteroarylene group having 4 to 24 carbon atoms;

at least one hydrogen atom of the alkylene group is substituted or unsubstituted with a cycloalkyl group having 3 to 24 carbon atoms, an aryl group having 6 to 24 carbon atoms, or a heteroaryl group having 4 to 24 carbon atoms;

$R_1$ represents hydrogen or a methyl group;

$n_1$ and $n_2$ each independently represent a natural number of 1 or larger;

Y represents a following chemical formula 2 or chemical formula 3:

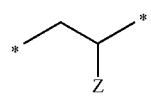

[Chemical formula 2]

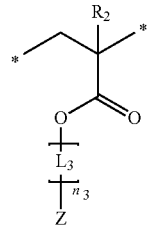

[Chemical formula 3]

wherein in the chemical formulas 2 and 3, Z represents an alkyl group having 1 to 12 carbon atoms, a cycloalkyl group having 3 to 24 carbon atoms, an aryl group having 6 to 24 carbon atoms, two or more heteroaryl groups or metallocenes connected to C, O, S, Se, N or P;

$R_2$ represents hydrogen or a methyl group;

$L_3$ represents polyethyleneoxy or ethyleneurethane, or alkylene group having 1 to 12 carbon atoms;

$n_3$ represents 0 or a natural number of 1 or larger.

2. The light-emitting structure of claim 1, wherein a content of the polymer represented by the chemical formula is in a range of about 1 wt % to about 95 wt % with respect to a total weight of the ligand coordinated to the surface of the inorganic nano-particle.

3. The light-emitting structure of claim 1, wherein the polymer having the structure represented by the chemical formula 1 includes repeating units copolymerized with monomers having an acrylic functional group or a vinyl group.

4. The light-emitting structure of claim 1, wherein the inorganic nanoparticle absorbs ultraviolet or visible light and emits visible light in a wavelength range of 400 nm to 750 nm.

5. The light-emitting structure of claim 1, wherein the inorganic nanoparticle has a diameter of 1 nm to 30 nm.

6. The light-emitting structure of claim 1, wherein the ligand represented by the chemical formula 1 is acquired between ligand-exchange between a ligand having a hydroxyl group as a terminal functional group thereof coordinated on the surface of the inorganic nano-particle and a polymer ligand having a structure represented by a following chemical formula 4:

[Chemical formula 4]

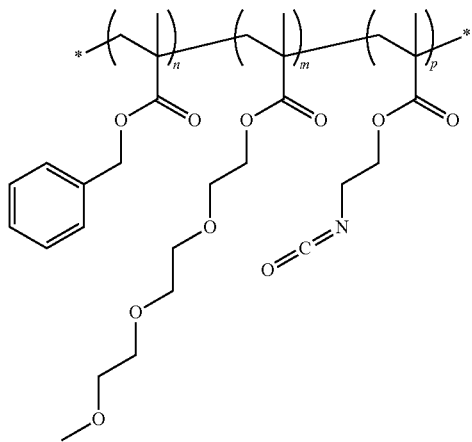

wherein, in the chemical formula 4, n, m and p each independently indicates a natural number equal to or greater than 1.

7. The light-emitting structure of claim 6, wherein the ligand represented by the chemical formula 1 is bound to the surface of the inorganic nano-particle to exhibit a structure having a following chemical formula 5:

[Chemical formula 5]

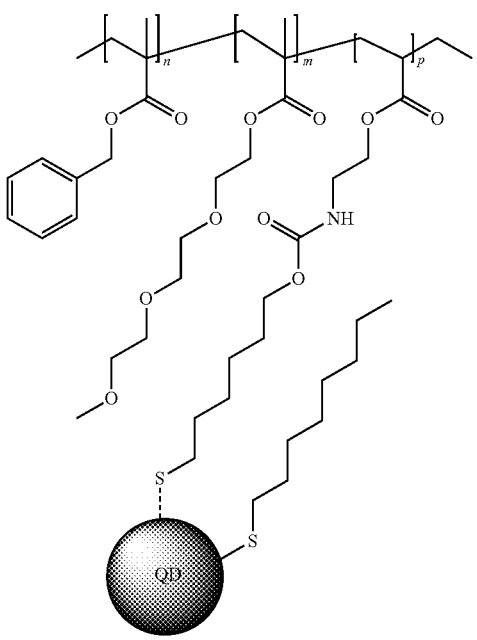

wherein in the chemical formula 5, n, m and p each independently indicates a natural number equal to or greater than 1.

8. An optical member comprising the light-emitting structure of claim 1.

9. A light-emitting device comprising the light-emitting structure of claim 1.

10. A liquid crystal display device comprising the light-emitting structure of claim 1.

* * * * *